(12) United States Patent
Sherry

(10) Patent No.: US 7,268,714 B2
(45) Date of Patent: Sep. 11, 2007

(54) RAPID RESPONSE CURRENT MEASUREMENT SYSTEM AND METHOD

(75) Inventor: Adrian Sherry, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/453,685

(22) Filed: Jun. 15, 2006

(65) Prior Publication Data

US 2007/0052571 A1 Mar. 8, 2007

Related U.S. Application Data

(60) Provisional application No. 60/691,364, filed on Jun. 17, 2005.

(51) Int. Cl.
*H03M 1/00* (2006.01)

(52) U.S. Cl. ...................................... 341/139; 341/155

(58) Field of Classification Search ................ 341/139, 341/155; 702/97, 107
See application file for complete search history.

(56) References Cited

U.S. PATENT DOCUMENTS

| 4,009,376 | A | * | 2/1977 | Faraguet | 702/97 |
| 4,016,557 | A | * | 4/1977 | Zitelli et al. | 341/139 |
| 5,777,911 | A | | 7/1998 | Sherry et al. | |
| 6,414,619 | B1 | * | 7/2002 | Swanson | 341/155 |
| 6,801,868 | B1 | * | 10/2004 | Medelius et al. | 702/107 |

* cited by examiner

*Primary Examiner*—Jean Bruner Jeanglaude
(74) *Attorney, Agent, or Firm*—Iandiorio & Teska

(57) ABSTRACT

A rapid response measurement is accomplished by providing to a programmable gain amplifier an input to be measured, providing to an analog to digital converter having a predetermined output rate, the output from the programmable gain amplifier, determining when the output is greater than full scale input range of the analog to digital converter in an interval shorter than the period of the predetermined output rate of the analog to digital converter and adjusting the gain of the programmable gain amplifier to reduce the output below the full scale of the analog to digital converter at a rate faster than the predetermined output rate of the ADC.

17 Claims, 6 Drawing Sheets

RAPID RESPONSE CURRENT MEASUREMENT SYSTEM AND METHOD

RELATED APPLICATIONS

This application claims benefit of U.S. Provisional Application Ser. No. 60/691,364 filed Jun. 17, 2005. This application is incorporated herein by this reference.

FIELD OF THE INVENTION

This invention relates to a rapid response measurement system and method and to such a system and method using an analog to digital converter for measuring rapid response to a change in current level.

BACKGROUND OF THE INVENTION

A current measurement system generally must measure a very wide range of current levels. For example in an automotive battery system, the net current supplied from the battery can range from hundreds or thousands of amperes when the engine is being started, to tens of milliamperes when the car is off. To accurately determine the state of the battery capacity, it is necessary to measure this current as accurately as possible. The current from the battery is generally first converted to a voltage, for example by placing a small valued resistor in series with the current flow, and this voltage is then converted to a digital form using an analog to digital converter (ADC). The voltage signal is generally first amplified with a programmable-gain-amplifier (PGA), so that when the current is of a low level the voltage signal is gained up by a large gain to make use of the full dynamic-range of the ADC. In addition, to perform high accuracy measurements of the small voltages produced from low currents, it is generally necessary to perform the analog to digital conversion at a relatively slow rate, minimizing the effects of noise in the measured signal and in the measurement system. The decision of what level of amplification and conversion speed to use is generally determined by a processor, based on previous ADC results. Because of the slow conversion rate when the current is low, a sudden increase in the current drawn from the battery may take a relatively long time to be reflected in the ADC conversion result. This is potentially a problem for measuring the state of the battery, because calculations to determine the capacity of the battery require high-speed measurements that start as soon as possible after large currents are drawn. Therefore it would be advantageous if a current measurement system could perform high-accuracy measurements when the current is at a low level, while simultaneously being able to rapidly react to a large increase in current. U.S. Pat. No. 5,777,911 describes a Digital Filtering System incorporating a selector section, for producing an output signal from either a relatively narrow or low frequency width filter or a relatively wide or high frequency width filter selectively in accordance with the time rate of change in the level of the input signal fed to the filtering system. This filtering system could potentially be used following an ADC in a current measurement system. However, this scheme relies on the input signal being always within the range of the digital filtering system, and, implicitly, the input signal to the ADC always being within the range of the ADC. The current measurement system generally requires the use of a high-gain amplifier preceding the ADC when the current is of a low-level. Therefore following a sudden increase in current the amplified input to the ADC will generally be outside the range of the ADC, and any results produced from the ADC will generally be clamped to +full-scale or −full-scale. Even if the digital filtering system switches to the wide-bandwidth filter the results are still in error because the input to the filtering system is over ranged.

SUMMARY OF THE INVENTION

It is therefore an object of this invention to provide an improved rapid response measurement system and method.

It is a further object of this invention to provide such an improved rapid response measurement system and method which responds quickly to a change in current level.

It is a further object of this invention to provide such an improved rapid response measurement system and method which includes an analog to digital converter and the rapid response time is faster than the output rate of the analog to digital converter.

It is a further object of this invention to provide such an improved rapid response measurement system and method which can automatically change gain and/or output rate and may reset the analog to digital converter.

It is a further object of this invention to provide such an improved rapid response measurement system and method which the over range detector circuitry can use some of the analog to digital converter.

It is a further object of this invention to provide such an improved rapid response measurement system and method which the over range detection can be filtered or averaged to reduce false triggers and provide glitch immunity.

The invention results from the realization that a truly rapid response measurement for accurate voltage or current measurement can be achieved with an over range detector which has a faster output rate than the analog to digital converter so that a change in the signal to the analog to digital converter beyond full scale can be quickly detected and the gain of a programmable gain amplifier and/or the output rate of the analog to digital converter can be adjusted accordingly to bring the signal back in range in an interval shorter than the period of the output rate of the analog to digital converter.

This invention features a rapid response measurement system including a programmable gain amplifier responsive to an input signal to be measured to produce an output signal and an analog to digital converter having a predetermined output rate and being responsive to the output signal. An over range detector has an output rate faster than the predetermined output rate and is responsive to the output signal to indicate when the output signal is greater than full scale for the analog to digital converter in an interval shorter than the period of the predetermined output rate of the analog to digital converter. A controller responsive to the over range detector adjusts the programmable gain amplifier to reduce the output signal below the full scale of the analog to digital converter.

In a preferred embodiment the over range detector may be directly responsive to the output signal at the input to the analog to digital converter. The input signal may be a voltage signal. The voltage signal may be developed across a sensing circuit in a load circuit whose current is to be measured. The analog to digital converter may include a $\Sigma\Delta$ modulator. The over range detector may be responsive to the output of the $\Sigma\Delta$ modulator. The controller may respond to the over range detector to increase the output rate of the analog to digital converter. The controller may respond to the over range detector to reset the analog to digital converter. The over range detector may include a counter circuit for counting the number of sequential like modulator outputs. The over range detector may include a comparator for indicating an over range when the number of sequential like modulator outputs exceeds a predetermined threshold. The controller may include a processor, the processor may be included in the analog to digital converter.

This invention also features a rapid response measurement method including providing to a programmable gain amplifier an input to be measured. The output from the programmable gain amplifier is provided to an analog to digital converter having a predetermined output rate. A determination is made of when the output is greater than full scale input range of the analog to digital converter in an interval shorter than the period of the predetermined output rate of the analog to digital converter. The gain of the programmable gain amplifier is adjusted to reduce the output below the full scale of the analog to digital converter at a rate faster than the predetermined output rate of the ADC.

This invention also features a rapid response measurement system including a programmable gain amplifier responsive to an input signal to be measured to produce an output signal. There is an analog to digital converter having a predetermined output rate and being responsive to the output signal and an over range detector having an output rate faster than the predetermined output rate and being responsive to the output signal to indicate when the output signal is greater than full scale for the analog to digital converter in an interval shorter than the period of the predetermined output rate of the analog to digital converter. A controller responsive to the over range detector adjusts the gain of the programmable gain amplifier to reduce the output below the full scale of the analog to digital converter.

This invention also features a rapid response measurement system including a programmable gain amplifier responsive to an input to be measured to produce an output. An analog to digital converter having a predetermined output rate is responsive to the output. The analog to digital converter includes a $\Sigma\Delta$ modulator. There is an over range detector which has an output rate faster than the predetermined output rate and is responsive to the output of the $\Sigma\Delta$ modulator to indicate when the output is greater than full scale for the analog to digital converter in an interval shorter than the period of the predetermined output rate of the analog to digital converter. A controller is responsive to the over range detector to adjust the gain of the programmable gain amplifier to reduce the output below the full scale of the analog to digital converter. The over range detector includes a counter circuit for counting the number of sequential like modulator outputs.

This invention also features a rapid response measurement system including a programmable gain amplifier responsive to an input to be measured to produce an output. An analog to digital converter has a predetermined output rate and is responsive to the output. An over range detector has an output rate faster than the predetermined output rate and is responsive to the output to indicate when the output is greater than full scale for the analog to digital converter in an interval shorter than the period of the predetermined output rate of the analog to digital converter. A controller is responsive to the over range detector to adjust the gain of the programmable gain amplifier to reduce the output below the full scale of the analog to digital converter. The over range detector includes a comparator circuit for indicating an over range when the number of sequential like modulator outputs exceeds a predetermined threshold.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
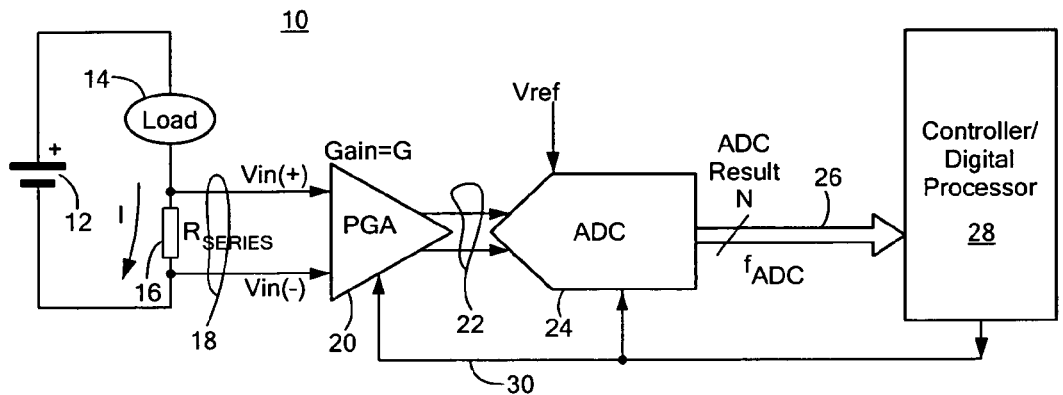
FIG. 1 is a schematic block diagram of a prior art current measurement system.

A side from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1 a prior art measurement system 10 for measuring, for example, the current, I, provided by a battery 12, such as an automobile battery, to load 14. Measurement system 10 includes series resistor 16 for converting current I to a differential input 18 including $V_{in}(+)$ and $V_{in}(-)$ to programmable gain amplifier 20 with gain G. The output from programmable gain amplifier 20 is also the input 22 to analog to digital converter 24 which is provided with a reference voltage $V_{ref}$. The output of analog to digital converter 24, ADC Result, is provided on line 26 at an output rate of $f_{ADC}$ to a controller, digital processor 28. When digital processor 28 senses a change in the current I being measured, for example an abrupt increase, it can feed back a command on line 30 to reduce the gain of programmable gain amplifier 20 and/or increase the output rate $f_{ADC}$ of analog to digital converter 24 and it can reset analog to digital converter 24.

Figure 2:
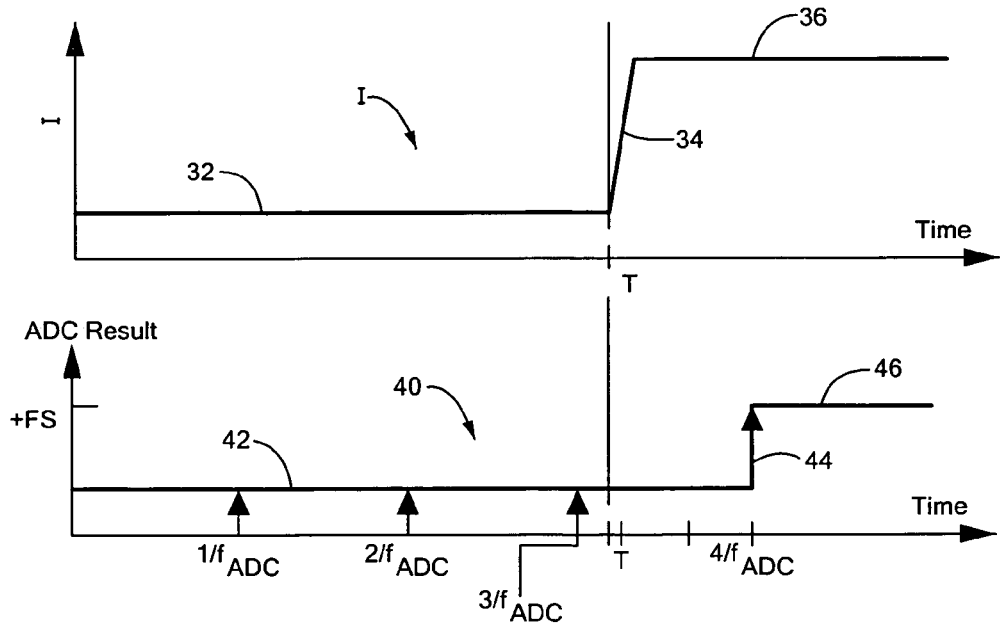
FIG. 2 shows the load current and ADC Result for the system of FIG. 1.

Such an occurrence is shown in FIG. 2 where the current I has a generally constant low level value 32 until time T when it abruptly rises at 34 to a high level 36. In accordance with prior art operation the system follows this change in current but only slowly. At each of the first three output times indicated as $1/f_{ADC}$, $2/f_{ADC}$, $3/f_{ADC}$, the current remains constant as at 42. In fact it remains constant well past $3/f_{ADC}$ and the time T when the current changes. In fact it is not until the next output at $4/f_{ADC}$ from analog to digital converter 24 that the ADC shows any sign of an increased current as at 44 where the current rises abruptly to the new higher level 46. That is, the system does not learn about the abrupt current rise at T until well after it occurs at the next normal output period $4/f_{ADC}$. The full settling time of the ADC may be longer than $1/f_{ADC}$, in which case it may take even longer for the system to learn of the change in current level. During that delay period, digital processor 28 is ignorant of the change in current and, in fact even after it is informed of the change of the current, it is ignorant of the extent to which the current has changed, for the new level 46 is topped out at full scale+FS while the true increase in current may be much much higher. While digital signal processor 28 is shown as a separate component in FIG. 1 this is not necessary as it is well understood that it may be incorporated as a part of analog to digital converter 24.

Analog to digital converter 24 has an allowable full scale input range of $+/-V_{ref}$ which means the input to the programmable gain amplifier shown as $[V_{in}(+)-V_{in}(-)]$ must be within the range of $+/-(V_{ref}/G)$ to produce a valid analog to digital converter result. The measurement system generally produces the highest degree of accuracy or equivalently has the least measurement noise when the gain, G, is as high as possible. Digital processor 28 can decide from previous analog to digital converter 24 result 26 both the gain setting, G, to be used in the programmable gain amplifier 20, and the conversion rate, $f_{ADC}$, to be used by the analog to digital converter 24 in order to maximize the conversion accuracy.

In one algorithm for choosing G, the processor 28 reduces the gain, G, if the analog to digital converter 24 produces a result indicating the input was greater than or equal to +/-full scale and the processor increases the gain, G, if the input is less than one half the full scale. This ensures that the signal is always processed with the maximum possible gain setting. Another algorithm uses intelligence about the state of the rest of the system e.g. the load to determine the gain setting to use. For example, if it is known by the processor that the load is in a high state of activity it is generally the case that a large current will be drawn and a low gain, G, is chosen. Conversely, if the system is in a low state of activity a high gain, G, can be chosen. A similar approach can be used to choose the conversion rate of the analog to digital converter 24 referred to as $f_{ADC}$. Here it is generally required to use a low conversion rate when the measured voltage is at a low level, to minimize the amount of measurement noise and a high conversion rate when the current is large. The decision on the gain, G, and update rate, $f_{ADC}$, to be used can be based on a single ADC Result at 26 or on a combination of a preceding number of ADC Results at 26 and the current ADC Result at 26. Digital processor 28 can therefore determine the current is too high for the current gain setting, G, of the programmable gain amplifier 20 by examining the ADC Results at 26. However, as taught by the prior art it can only process this information at the rate that the analog to digital converter 24 supplies data, namely at $f_{ADC}$, which may be at a relatively slow rate during high accuracy conversions. This is generally too slow to respond to large increases in current that require a rapid reduction in gain, G, and increase in output rate, $f_{ADC}$.

Figure 3:
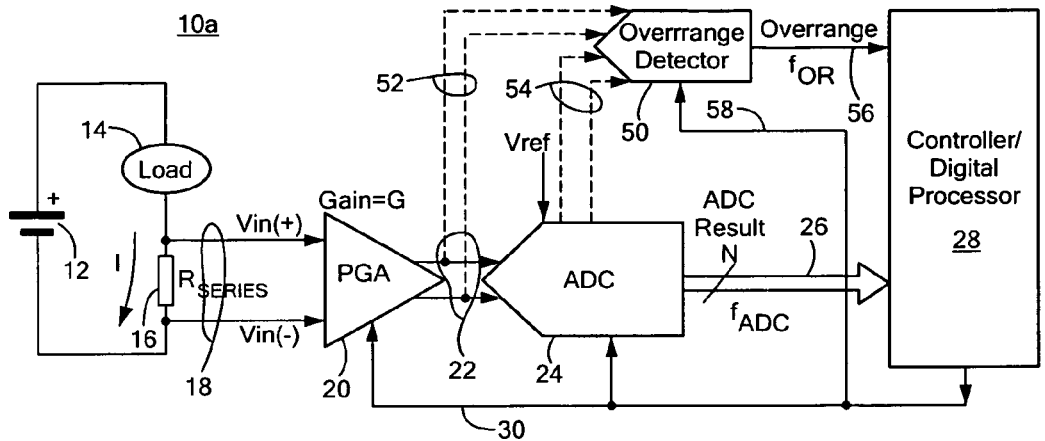
FIG. 3 is a schematic block diagram of the rapid response measurement system according to this invention.

In accordance with this invention a rapid response current measurement system 10a, FIG. 3, a similar concept could be used in a voltage measurement system (or any other measurement system, e.g. capacitance,) as with the system in FIG. 1, which uses an additional circuit component over range detector 50 to detect when the input at 22 to ADC 24 is outside its full scale or operating range. The two dashed pair of lines 52 and 54 indicate that the input to over range detector 50 can be taken from the input to ADC 24 either directly, at input lines 22, or from an intermediate stage in the analog to digital converter 24 conversion, depending upon the implementation used. When over range detector 50 detects an over range it provides a signal over range on line 56 to controller, digital processor 28 which then on line 30 can adjust or change, e.g. decrease the gain of programmable gain amplifier 20 and/or adjust or change, e.g. increase the output rate of analog to digital converter 24. It can also reset analog to digital converter 24 and reset over range detector 50. The over range output occurs at a rate of $f_{OR}$, where $f_{OR}>>f_{ADC}$, when analog to digital converter 24 is running at a slow rate. This output at 56 indicates whether the input signal at 22 is outside the range for valid results of the analog to digital converter 24. The signal on line 56 is used by the digital processor 28 to change the analog to digital converter 24 output speed to another speed, $f_{ADC}2$ for example, a faster speed, and change the gain of programmable gain amplifier 20 to another gain, G2, for example, a lower gain. Analog to digital converter 24 then performs a conversion with these settings. The conversion result is available after $1/f_{ADC}2$ (or $N*1/f_{ADC}2$ if the analog to digital converter 24 requires a number of cycles, N, to settle after a configuration change.) Since the time $1/f_{OR}$ is much less than $f_{ADC}$, analog to digital converter 24 can be reconfigured and switched to a faster output rate, ($f_{ADC}2$), much faster than if the decision to change configuration was based solely on the analog to digital converter 24 outputs at 26.

Figure 4:
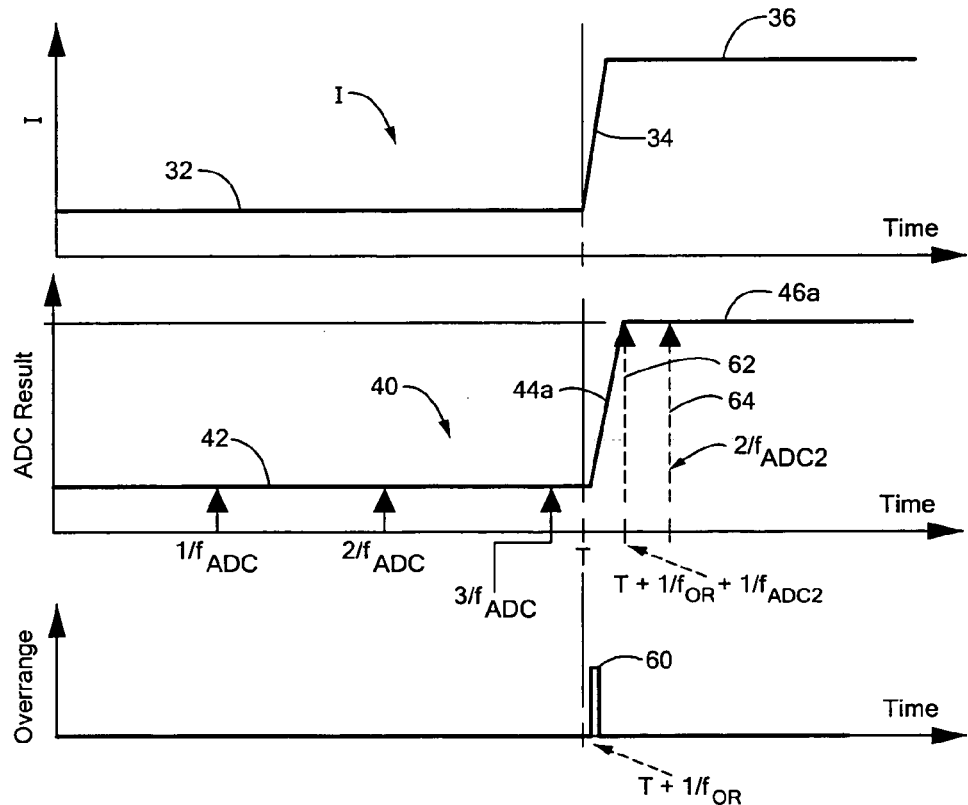
FIG. 4 shows the load current, ADC Result and over range signal for the system of FIG. 3.

FIG. 4 shows the response of the system to increase in current at time T. A short time after time T, namely an interval $1/f_{OR}$, the over range signal on line 56 interrupts processor 28 and processor 28 immediately changes the gain G of the programmable gain amplifier 20 and the speed of the output rate of analog to digital converter 24 from the slower $f_{ADC}$ to the faster $f_{ADC}2$. The over range detector 50 is automatically cleared by a signal on line 58 when the analog to digital converter 24 output rate and programmable gain amplifier 20 gain G are changed by a signal on line 58. After another period of time, interval $1/f_{ADC}2$, an analog to digital converter Result is available with the new programmable gain amplifier 20 configuration. The total time to an ADC Result after time T is therefore $1/f_{OR}+1/f_{ADC}2$ which is significantly less than the previous system provided $1/f_{OR}<<1/f_{ADC}$. Thus in FIG. 4 it can be seen that the over range signal occurs immediately after time T at time $T+1/f_{OR}$ 60 at that point the gain G is reduced. The output rate is increased to $f_{ADC}2$ so the full output current ADC Result 46a is available at $T+1/f_{OR}+1/f_{ADC}2$, and the next ADC output occurs at $T+1/f_{OR}+2/f_{ADC}2$ as indicated by samples 62 and 64.

Figure 5:
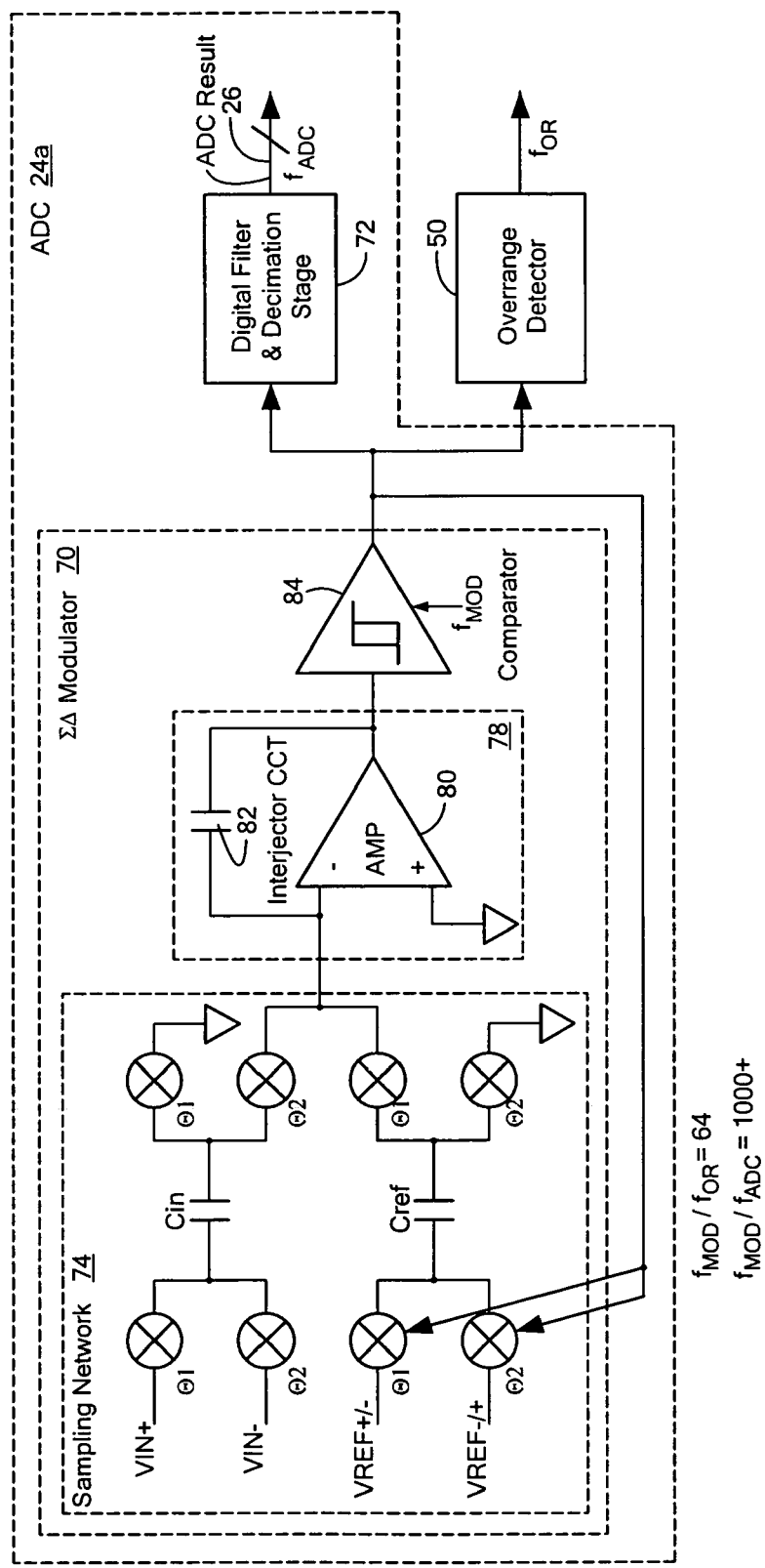
FIG. 5 is a more detailed schematic block diagram of the analog to digital converter of FIG. 3 implemented with a first order $\Sigma\Delta$ analog to digital converter with an over range detector according to this invention.

The implementation of the over range detector 50 could be a comparator or could use a portion of analog to digital converter 24 to implement a fast comparison. In one embodiment of the invention, FIG. 5, analog to digital converter 24a includes a ΣΔ modulator 70 and digital filter and decimation stage 72. ΣΔ modulator 70 includes a sampling network 74, integrator circuit 78 including integrating amplifier 80, and integrating capacitor 82 and comparator 84. The output of the modulator goes to a digital filter+decimation stage. Although analog to digital converter 24 is shown here as a ΣΔ analog to digital converter, ΣΔ modulator 70 is shown as only a first order modulator and comparator 84 is shown as a single-bit comparator these are not necessary limitations of the invention. The conversion time of the ΣΔ analog to digital converter 24a, which determines its response time to a change in input, is determined by the configuration of a programmable digital filter. In this embodiment the over range detector 50 is implemented by additionally applying the output 88 of the ΣΔ modulator 70 to a simple digital filter e.g. a counter. There is a certain class of programmable gain amplifiers, (PGA) where the PGA can be embedded as part of a ΣΔ modulator sampling network. For example, different gains are implemented by changing the ratio of $C_{in}$ to $C_{ref}$ in FIG. 5. In this case there is no uniquely identifiable "output signal" of the PGA it is really a "charge" rather than a "signal".

Figure 6:
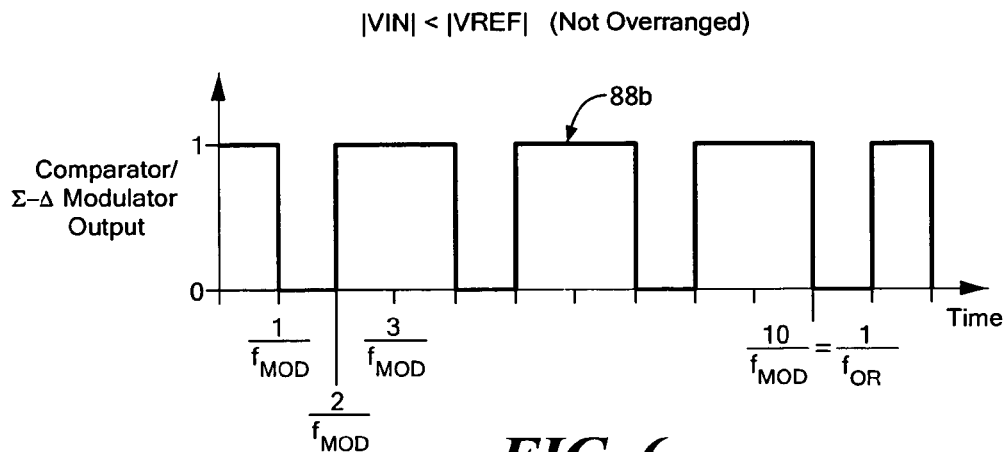
FIG. 6 shows the output of the $\Sigma\Delta$ modulator of FIG. 5 in normal operation.
Figure 7:
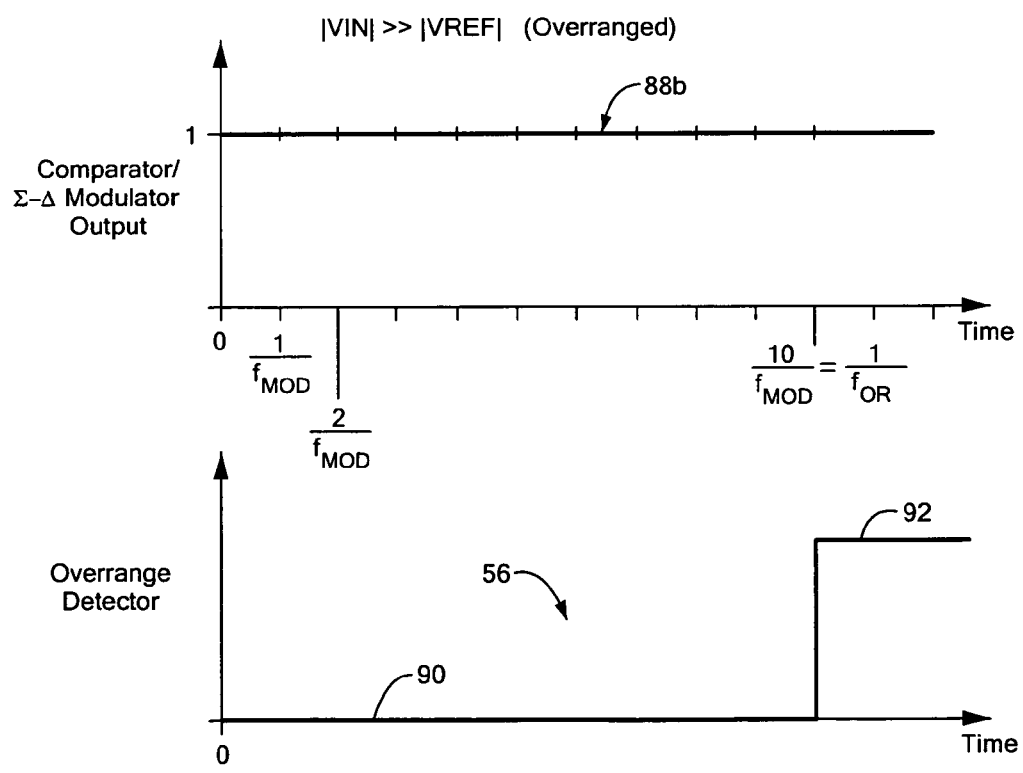
FIG. 7 shows the output of the $\Sigma\Delta$ modulator of FIG. 5 in over range operation and the concurrent output of the over range detector.

In normal operation, that is, where the system is not over ranged: $|V_{in}|<|V_{REF}|$ comparator 84 has an output 88a, FIG. 6, which is a signal-dependent time-varying distribution of ones and zeroes occurring at times $1/f_{MOD}$, $2/f_{MOD}$, $3/f_{MOD}$ .... In an over ranged condition, FIG. 7, where: $|V_{in}|>>|V_{REF}|$ comparator 84 output 88b may be all ones, that is a sequence of, for example, ten or more ones or a sequence of ten or more zeroes. In that case over range detector 50 provides an output 56 which is initially zero as shown at 90 and then, when the requisite number of sequential ones (or zeros) is reached, it switches to a high state 92 that provides the over range signal to digital processor 28. Capacitors $C_{in}$ and $C_{ref}$ in sampling network 74 are in general not equal. The ratio of these capacitors influences at what point the input signal to the modulator causes the modulator output to be all 1's or all 0's.

Figure 8:
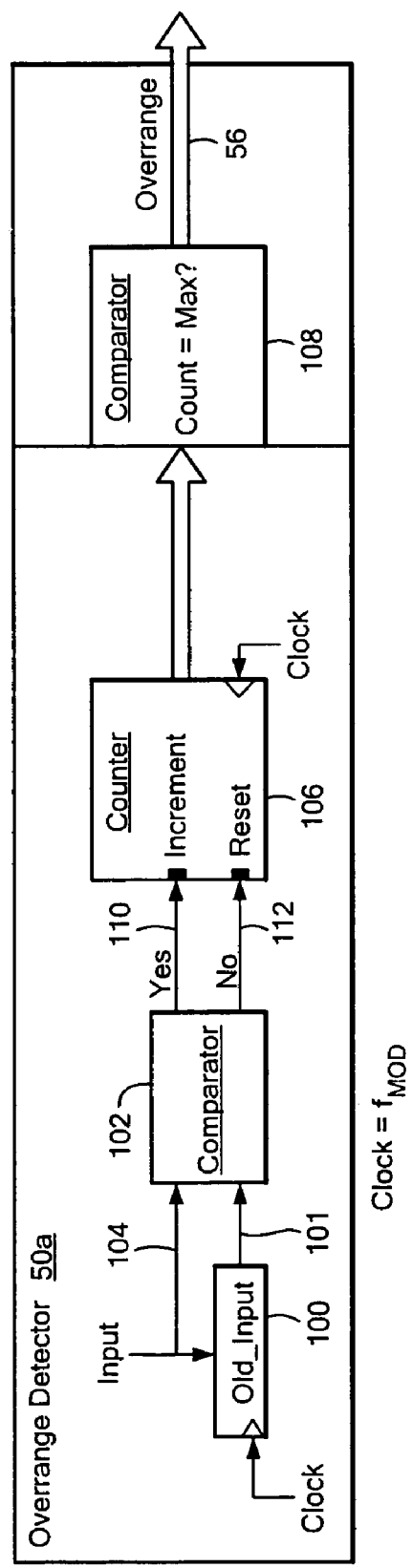
FIG. 8 is a schematic block diagram of an over range detector implemented with a counter.

In one embodiment over range detector 50a, FIG. 8, includes a clocked storage element 100, with input 104 and output 101 which provides one input to comparator 102 the other input of which is the input on line 104. Comparator 102 provides a yes or no increment or reset signal to counter 106 whose output is monitored by comparator 108. In operation a new input on line 104 is compared to the last previous input on 104 by comparator 102. If they are the same, a signal appears on line 110 to increment counter 106. If they are dissimilar a signal appears on line 112 to reset counter 106. Comparator 108 monitors counter 106 for a predetermined count, for example ten. If ten sequential inputs are all the same, that is all ones or all zeroes, comparator 108 provides the over range output on line 56. A benefit is that momentary "spikes" in the ADC input do not cause the over range detector to go high: only when the input stays high for a period of time will the over range detect be set.

Figure 9:
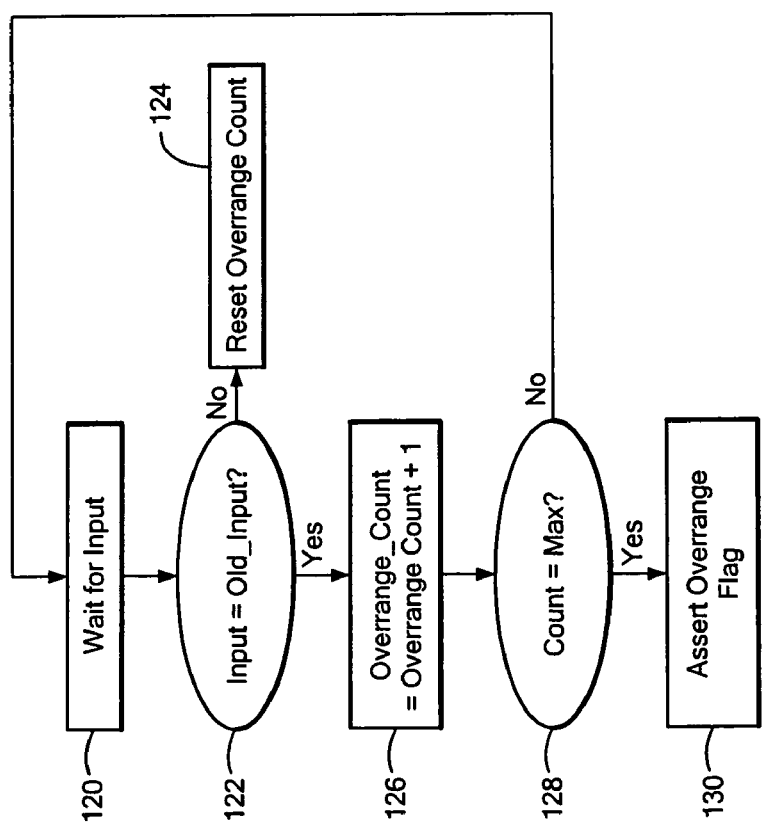
FIG. 9 is a flow chart illustrating operation of the over range detector of FIG. 8.

In operation, FIG. 9, the system waits for input, 120, then queries is the new input equal to the old input? in step 122. If it is not, then the counter is reset in step 124. If it is the same, the counter is incremented by one in step 126. Next a query is made as to whether the counter has been maxed out in step 128. If it hasn't been maxed out then the system returns to wait for an input at 120. If it has been maxed out the over range flag is asserted in step 130 and the over range output is provided on line 56.

Figure 10:
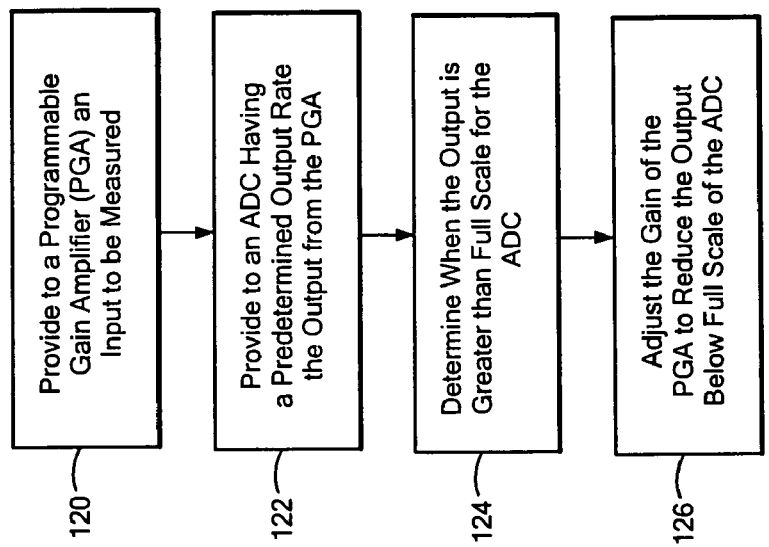
FIG. 10 is an illustration of the method of this invention.

The invention also includes a rapid response measurement method, FIG. 10, which provides to a programmable gain amplifier (PGA) an input to be measured 120 and provides to an ADC, which has a predetermined output rate, the output from the PGA, 122. It is determined when the output is greater than the predetermined full scale input range of the ADC, 124 and the gain of the PGA is adjusted 126, at a rate faster than the predetermined output rate of the ADC, to reduce the output below full scale of the ADC.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

What is claimed is:

1. A rapid response measurement system comprising:
   a programmable gain amplifier responsive to an input to be measured to produce an output;
   an analog to digital converter having a predetermined output rate and being responsive to said output;
   an over range detector having an output rate faster than said predetermined output rate and being responsive to said output to indicate when said output is greater than full scale for said analog to digital converter in an interval shorter than the period of said predetermined output rate of said analog to digital converter; and
   a controller responsive to said over range detector to adjust the gain of said programmable gain amplifier to reduce said output below the full scale of the analog to digital converter.

2. The rapid response measurement system of claim 1 in which said over range detector is directly responsive to said output at the input to said analog to digital converter.

3. The rapid response measurement system of claim 1 in which said input is a voltage signal.

4. The rapid response measurement system of claim 3 in which said voltage signal is developed across a sensing circuit in a load circuit whose current is to be measured.

5. The rapid response measurement system of claim 1 in which said analog to digital converter includes a ΣΔ modulator.

6. The rapid response measurement system of claim 5 in which said over range detector is responsive to the output of said ΣΔ modulator.

7. The rapid response measurement system of claim 1 in which said controller responds to said over range detector to change the output rate of said analog to digital converter.

8. The rapid response measurement system of claim 1 in which said controller responds to said over range detector to increase the output rate of said analog to digital converter.

9. The rapid response measurement system of claim 1 in which said controller responds to said over range detector to reset said analog to digital converter.

10. The rapid response measurement system of claim 6 in which said over range detector includes a counter circuit for counting the number of sequential like said modulator outputs.

11. The rapid response measurement system of claim 10 in which said over range detector includes a comparator circuit for indicating an over range when the number of sequential like said modulator outputs exceeds a predetermined threshold.

12. The rapid response measurement system of claim 1 in which said controller includes a processor.

13. The rapid response measurement system of claim 12 in which said processor is included in said analog to digital converter.

14. A rapid response measurement method comprising:
   providing to a programmable gain amplifier an input to be measured;
   providing to an analog to digital converter having a predetermined output rate said output from said programmable gain amplifier;
   determining when said output is greater than full scale input range of said analog to digital converter in an interval shorter than the period of said predetermined output rate of said analog to digital converter; and adjusting the gain of said programmable gain amplifier at a rate faster than the predetermined output rate of the ADC to reduce said output below the full scale of the analog to digital converter.

15. A rapid response measurement system comprising:

a programmable gain amplifier responsive to an input signal to be measured to produce an output signal;

an analog to digital converter having a predetermined output rate and being responsive to said output signal;

an over range detector having an output rate faster than said predetermined output rate and being responsive to said output signal to indicate when said output signal is greater than full scale for said analog to digital converter in an interval shorter than the period of said predetermined output rate of said analog to digital converter; and a controller responsive to said over range detector to adjust the gain of said programmable gain amplifier to reduce said output signal below the full scale of the analog to digital converter.

16. A rapid response measurement system comprising:

a programmable gain amplifier responsive to an input to be measured to produce an output;

an analog to digital converter having a predetermined output rate and being responsive to said output; said analog to digital converter including a $\Sigma\Delta$ modulator;

an over range detector having an output rate faster than said predetermined output rate and being responsive to the output of said $\Sigma\Delta$ modulator to indicate when said output is greater than full scale for said analog to digital converter in an interval shorter than the period of said predetermined output rate of said analog to digital converter; and a controller responsive to said over range detector to adjust the gain of said programmable gain amplifier to reduce said output below the full scale of the analog to digital converter; said over range detector including a counter circuit for counting the number of sequential like said modulator outputs.

17. A rapid response measurement system comprising:

a programmable gain amplifier responsive to an input to be measured to produce an output;

an analog to digital converter having a predetermined output rate and being responsive to said output; said analog to digital converter including a $\Sigma\Delta$ modulator;

an over range detector having an output rate faster than said predetermined output rate and being responsive to the output of said $\Sigma\Delta$ modulator to indicate when said output is greater than full scale for said analog to digital converter in an interval shorter than the period of said predetermined output rate of said analog to digital converter; and a controller responsive to said over range detector to adjust the gain of said programmable gain amplifier to reduce said output below the full scale of the analog to digital converter; said over range detector including a comparator circuit for indicating an over range when the number of sequential like said modulator outputs exceeds a predetermined threshold.

* * * * *